United States Patent
Yang et al.

(10) Patent No.: US 10,090,328 B2
(45) Date of Patent: Oct. 2, 2018

(54) SEMICONDUCTOR DEVICE

(71) Applicant: Samsung Electronics Co., Ltd., Suwon-si, Gyeonggi-do (KR)

(72) Inventors: Junggil Yang, Suwon-si (KR); Dong Il Bae, Incheon (KR); Geumjong Bae, Suwon-si (KR); Seungmin Song, Yongin-si (KR); Jongho Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 77 days.

(21) Appl. No.: 15/429,719

(22) Filed: Feb. 10, 2017

(65) Prior Publication Data

US 2017/0352684 A1  Dec. 7, 2017

(30) Foreign Application Priority Data

Jun. 7, 2016  (KR) .................... 10-2016-0070494

(51) Int. Cl.
| | |
|---|---|
| *H01L 23/48* | (2006.01) |
| *H01L 27/12* | (2006.01) |
| *H01L 27/02* | (2006.01) |
| *H01L 29/78* | (2006.01) |

(52) U.S. Cl.
CPC ...... *H01L 27/1203* (2013.01); *H01L 27/0207* (2013.01); *H01L 29/7856* (2013.01); *H01L 2029/7858* (2013.01)

(58) Field of Classification Search
CPC ............ H01L 27/1203; H01L 27/0207; H01L 29/7856
See application file for complete search history.

(56) References Cited

U.S. PATENT DOCUMENTS

| | | | | |
|---|---|---|---|---|
| 9,123,567 | B2* | 9/2015 | Radosavljevic | ............................ H01L 21/823821 |
| 9,431,512 | B2* | 8/2016 | Koh | ...................... B82Y 10/00 |
| 9,653,289 | B1* | 5/2017 | Balakrishnan | ........ H01L 27/088 |
| 9,653,547 | B1* | 5/2017 | Chang | .................. H01L 29/0673 |
| 2006/0240622 | A1* | 10/2006 | Lee | ................... H01L 29/42392 438/257 |
| 2007/0034973 | A1* | 2/2007 | Yun | ................... H01L 29/42392 257/408 |
| 2007/0196973 | A1* | 8/2007 | Park | ............... H01L 21/823412 438/197 |
| 2008/0099849 | A1* | 5/2008 | Kim | ................. H01L 29/42392 257/365 |

(Continued)

OTHER PUBLICATIONS

C.-H. Jan et al., "A 14 nm SoC Platform Technology Featuring 2nd Generation Tri-Gate Transistors,70 nm Gate Pitch, 52 nm Metal Pitch, and 0.0499 um2 SRAM cells, Optimized for Low Power, High Performance and High Density SoC Products", 2015 Symposium on VLSI Technology Digest of Technical Papers, p. T12-T13.

*Primary Examiner* — Nicholas Tobergte
(74) *Attorney, Agent, or Firm* — Harness, Dickey & Pierce, P.L.C.

(57) ABSTRACT

A semiconductor device includes an insulating layer on a substrate, a first channel pattern on the insulating layer and contacting the insulating layer, second channel patterns on the first channel pattern and being horizontally spaced apart from each other, a gate pattern on the insulating layer and surrounding the second channel patterns, and a source/drain pattern between the second channel patterns.

18 Claims, 23 Drawing Sheets

(56) References Cited

U.S. PATENT DOCUMENTS

| | | |
|---|---|---|
| 2010/0264496 A1 | 10/2010 | Thomas et al. |
| 2011/0124161 A1 | 5/2011 | Ernst et al. |
| 2014/0034908 A1 | 2/2014 | Bangsaruntip et al. |
| 2014/0151639 A1* | 6/2014 | Chang ............... H01L 29/42392 257/27 |
| 2014/0175374 A1 | 6/2014 | Chang et al. |
| 2014/0264280 A1* | 9/2014 | Kim ..................... H01L 29/785 257/29 |
| 2014/0326955 A1 | 11/2014 | Barraud et al. |
| 2014/0353574 A1 | 12/2014 | Li et al. |
| 2015/0053912 A1 | 2/2015 | Ching et al. |
| 2015/0060997 A1 | 3/2015 | Basu et al. |
| 2015/0372104 A1* | 12/2015 | Liu ................... H01L 29/42364 257/77 |

* cited by examiner

SEMICONDUCTOR DEVICE

CROSS-REFERENCE TO RELATED APPLICATION

This application claims priority under 35 U.S.C. § 119 to Korean Patent Application No. 10-2016-0070494 filed on Jun. 7, 2016 in the Korean Intellectual Property Office, the disclosure of which is hereby incorporated by reference in its entirety.

BACKGROUND

1. Field

Example embodiments of the inventive concepts relate to semiconductor devices, and for example, at least some example embodiments relate to semiconductor devices including a gate-all-around (GAA) structure.

2. Description of Related Art

Semiconductor devices owing to high performance, small size and/or low manufacturing cost characteristics have been used in an electronics industry. The semiconductor devices may be classified into semiconductor memory devices for storing logical data, semiconductor logic devices for calculating the logical data and hybrid semiconductor devices including a memory element and a logic element. As the electronic industry has been highly developed, a demand for semiconductor devices of high speed, high reliability and multifunction has increased. To meet these characteristics of the semiconductor devices, the semiconductor devices are highly integrated and internal structures in the semiconductor devices are also highly complicated.

SUMMARY

According to example embodiments of the inventive concepts, a semiconductor device may include an insulating layer on a substrate, a first channel pattern on the insulating layer and contacting the insulating layer, second channel patterns on the first channel pattern and being horizontally spaced apart from each other, a gate pattern on the insulating layer and surrounding the second channel patterns, and a source/drain pattern between the second channel patterns.

According to example embodiments of the inventive concepts, a semiconductor device may include an insulating layer on a substrate, channel patterns on the insulating layer and being vertically spaced apart from each other, the channel patterns including a first channel pattern corresponding to a lowermost one of the channel patterns and a second channel pattern on the first channel pattern, a gate pattern on the insulating layer and surrounding the second channel pattern, and a source/drain pattern at a side of the gate pattern. Bottom surface of the first channel pattern may be positioned at substantially the same level as a bottom surface of the source/drain pattern relative to a top surface of the substrate.

According to example embodiments of the inventive concepts, a semiconductor device may include a first channel pattern contacting an insulating layer, a gate pattern on the channel pattern, a source/drain pattern at a side of the gate pattern, and second channel patterns with gate-all-around structures on the channel pattern.

BRIEF DESCRIPTION OF THE DRAWINGS

The foregoing and other features of inventive concepts will be apparent from the more particular description of non-limiting example embodiments of inventive concepts, as illustrated in the following drawings.

Example embodiments will be more clearly understood from the following detailed description taken in conjunction with the accompanying drawings.

DETAILED DESCRIPTION

Figure 1:
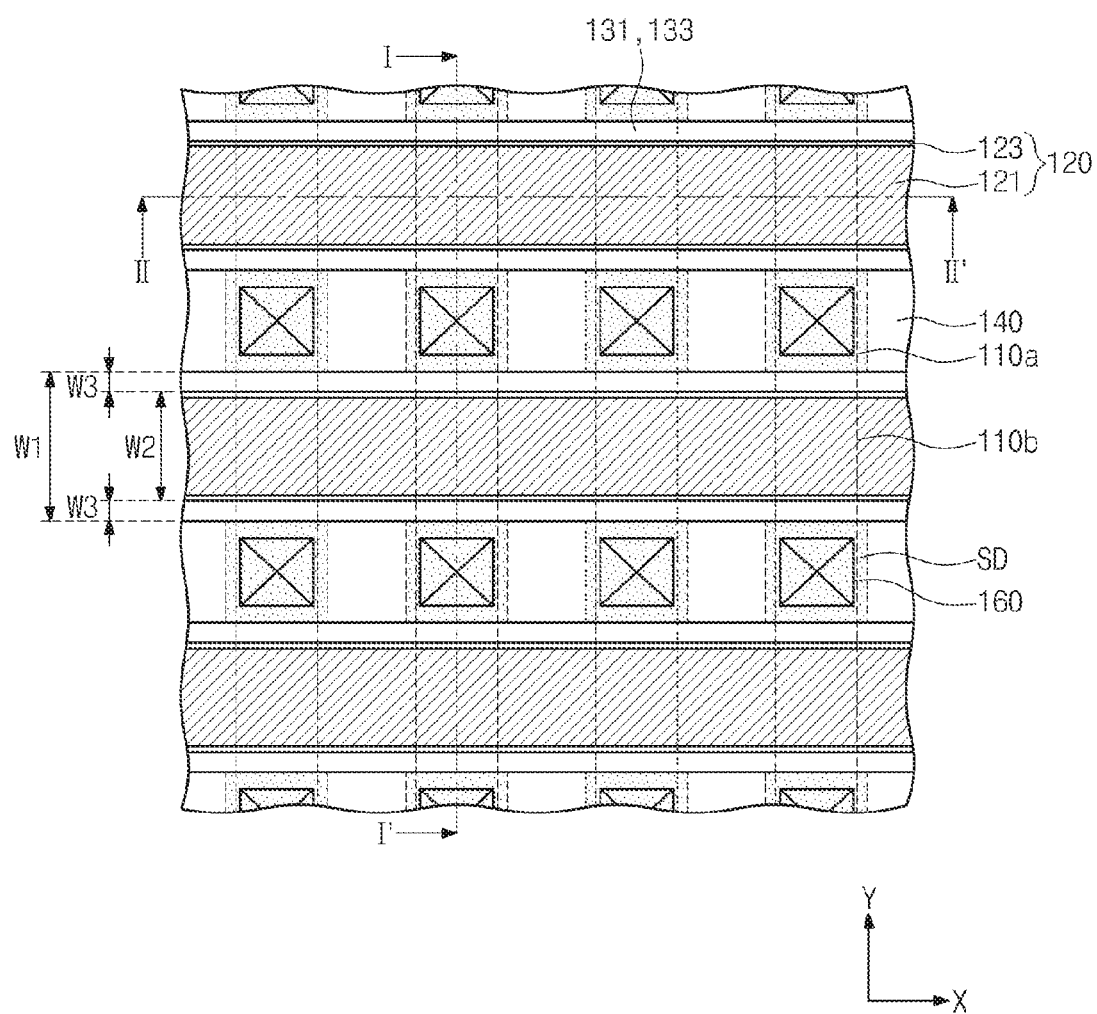
FIG. 1 is a plan view illustrating a semiconductor device according to an example embodiment.

Various example embodiments will now be described more fully with reference to the accompanying drawings in which some example embodiments are shown. However, the inventive concepts may be embodied in many alternate forms and should not be construed as limited to only example embodiments set forth herein.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Other words used to describe the relationship between elements or layers should be interpreted in a like fashion (e.g., "between" versus "directly between," "adjacent" versus "directly adjacent," "connected" versus "directly connected"). As used herein the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
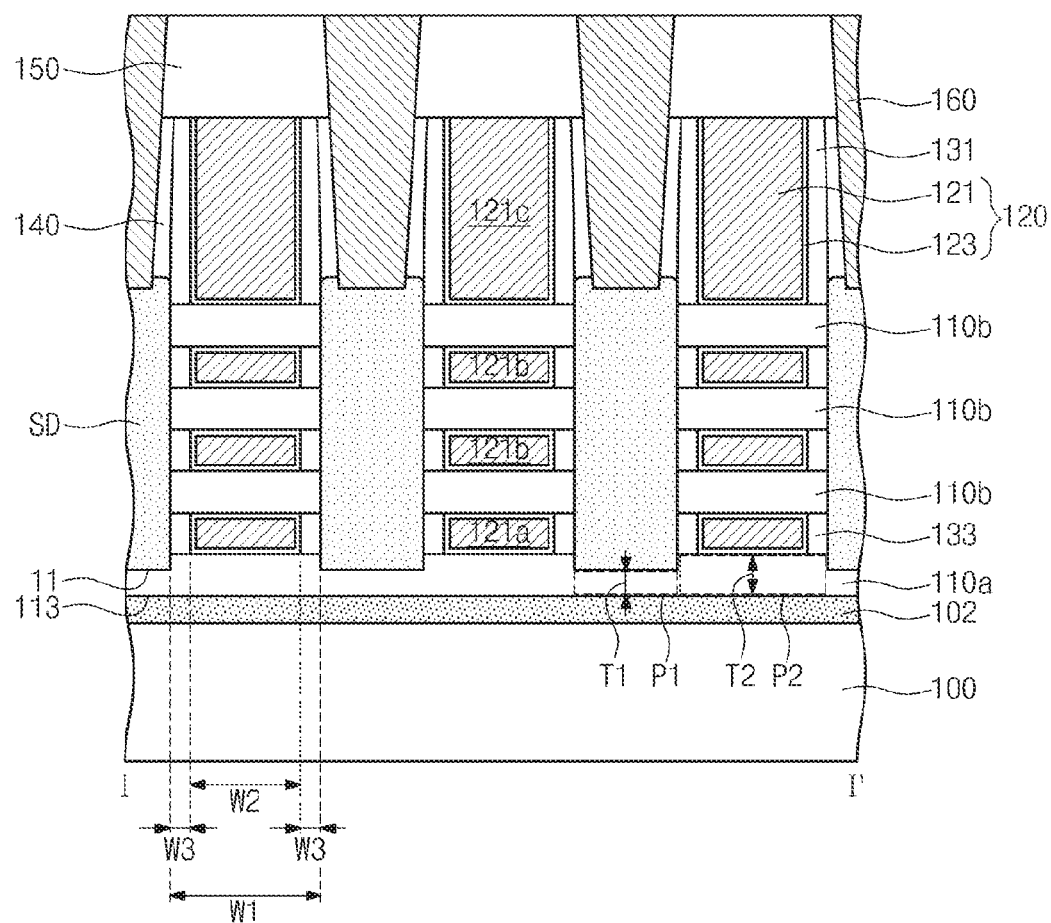
FIG. 2 is a cross-sectional view taken along line I-I' of FIG. 1 according to some example embodiments.
Figure 3:
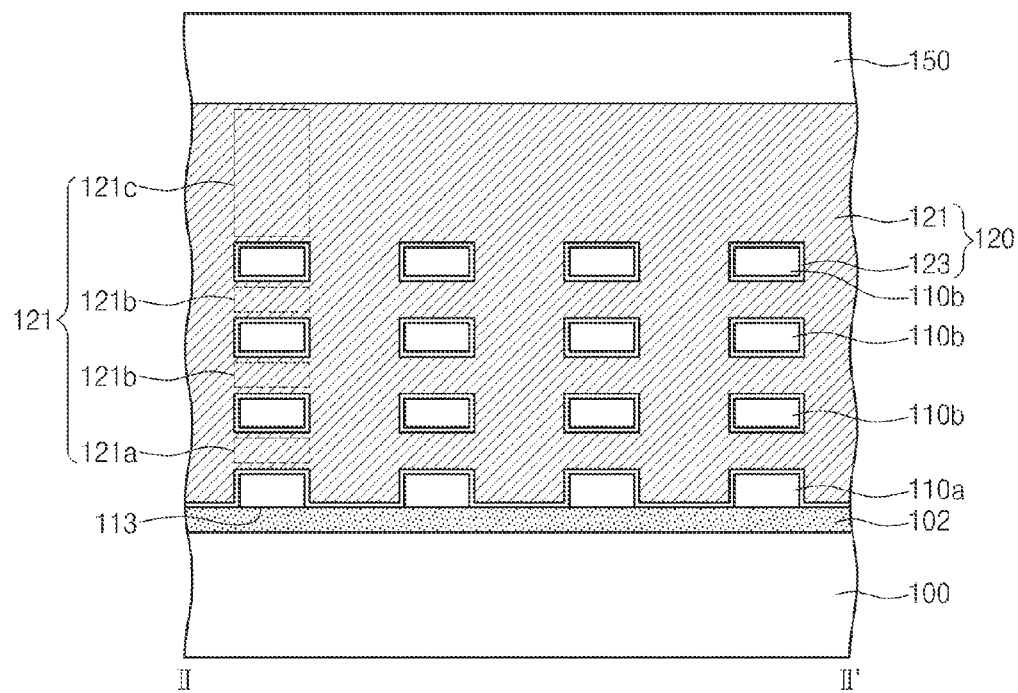
FIG. 3 is a cross-sectional view taken along line II-II' of FIG. 1.

FIG. 1 is a plan view illustrating a semiconductor device according to an example embodiment. FIG. 2 is a cross-sectional view taken along line I-I' of FIG. 1 according to some example embodiments. FIG. 3 is a cross-sectional view taken along line II-II' of FIG. 1 according to some example embodiments.

Referring to FIGS. 1, 2 and 3, an insulating layer 102 may be disposed on a substrate 100. The substrate 100 may include a silicon substrate, a silicon-germanium substrate, a germanium substrate, or a single crystal epitaxial layer grown from a single crystal silicon substrate. The insulating layer 102 may include a silicon oxide layer.

Channel patterns 110a and 110b may be disposed on the insulating layer 102 and may be spaced apart from each other in a vertical direction with respect to a top surface of the substrate 100. The channel patterns 110a and 110b may include first channel patterns 110a and second channel patterns 110b. The first channel patterns 110a may be arranged to be spaced apart from each other in a first direction X and may extend in a second direction Y. The first channel patterns 110a may correspond to lowermost ones of the channel patterns 110a and 110b. As an example, the first channel patterns 110a may contact the insulating layer 102.

The second channel patterns 110b may be disposed on the first channel patterns 110a. As an example, the second channel patterns 110b may be disposed on the single first channel pattern 110a in the vertical direction and may be horizontally spaced apart from each other. At least one of the second channel patterns 110b may be disposed on the single first channel pattern 110a to be vertically spaced apart from the single first channel pattern 110a. The second channel patterns 110b that are positioned at the same level relative to the top surface of the substrate 100 may be spaced apart from each other in the first direction X and the second direction Y. The second channel patterns 110b may each extend further in the second direction Y than in the first direction X. The channel patterns 110a and 110b may include, for example, silicon (Si).

The first channel patterns 110a may each include a first part P1 and a second part P2. The first part P1 may be disposed between the second channel patterns 110b adjacent in the second direction Y, and the second part P2 may be disposed under the second channel patterns 110b. As an example, a top surface of the first part P1 may be positioned at a lower level than a top surface of the second part P2 relative to the top surface of the substrate 100. As an example, a thickness T1 of the first part P1 may be smaller than a thickness T2 of the second part P2 (T1<T2).

Gate patterns 120 may be disposed on the insulating layer 102. The gate patterns 120 may extend in the first direction X and may be spaced apart from each other in the second direction Y. The gate patterns 120 may each include a conductive pattern 121 and a gate insulating layer 123. The conductive pattern 121 may be disposed on the insulating layer 102. The conductive pattern 121 may surround the second channel patterns 110b. For example, the conductive pattern 121 may be disposed on top surfaces, sidewalls and bottom surfaces of the second channel patterns 110b. The conductive pattern 121 may be disposed on some surfaces of the first channel patterns 110a. For example, the conductive pattern 121 may be disposed on top surfaces and sidewalls of the first channel patterns 110a but may not be disposed on bottom surfaces of the first channel patterns 110a. The conductive pattern 121 may include, for example, at least one metal such as tantalum (Ta), titanium (Ti), aluminum (Al), hafnium (Hf), tungsten (W), metal nitride, metal carbide, and/or metal silicide.

The gate insulating layer 123 may be disposed between the first and second channel patterns 110a and 110b and the conductive pattern 121. The gate insulating layer 123 that is disposed on the top surfaces and the sidewalls of the first channel patterns 110a may extend on the top surface of the insulating layer 102. As an example, the gate insulating layer 123 may contact the insulating layer 102. The gate insulating layer 123 may include, for example, a high-k dielectric layer and/or a silicon oxide layer. The high-k dielectric layer may include, for example, at least one of hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$), tantalum oxide ($TaO_2$), zirconium silicon oxide (ZrSiO), aluminum oxide ($Al_2O_3$) and lanthanum oxide ($La_2O_3$).

The conductive pattern 121 may include first through third conductive patterns 121a, 121b and 121c. The first conductive pattern 121a may be disposed between the first channel patterns 110a and lowermost ones of the second channel patterns 110b. The second conductive pattern 121b may be disposed between the second channel patterns 110b adjacent in the vertical direction, and the third conductive pattern 121c may be disposed on uppermost ones of the second channel patterns 110b. A thickness of the third conductive pattern 121c may be greater than a thickness of each of the first and second conductive patterns 121a and 121b.

Source/drain patterns SD may be disposed on the first channel patterns 110a. As an example, the source/drain patterns SD may be disposed between the gate patterns 120 adjacent in the second direction Y. For example, the source/drain patterns SD may be disposed on the respective first channel patterns 110a and may be disposed between the second channel patterns 110b adjacent in the second direction Y. The source/drain patterns SD may be disposed on the first parts P1 of the first channel patterns 110a. The source/drain patterns SD may each contact the first and second channel patterns 110a and 110b. Top surface of source/drain patterns SD may be positioned at a higher level than top surfaces of the uppermost second channel patterns 110b relative to the top surface of the substrate 100. As an example, bottom surfaces 11 of the source/drain patterns SD may be positioned at a higher level than the bottom surfaces 113 of the first channel patterns 110a with respect to the substrate 100. Lower portions of the source/drain patterns SD may be positioned in the first channel patterns 110a. The source/drain patterns SD may include, for example, silicon (Si). As an example, the source/drain patterns SD may include an epitaxial layer.

The source/drain patterns SD may include impurities. The impurities may include, for example, at least one of phosphorus (P), carbon (C), boron (B) and tin (Sn). In some example embodiments, in the case in which the semiconductor device is a PMOS transistor and the first and second channel patterns 110a and 110b include silicon, the source/drain patterns SD may include silicon-germanium or germanium. In other example embodiments, in the case in which the semiconductor device is an NMOS transistor and the first and second channel patterns 110a and 110b include silicon (Si), the source/drain patterns SD may include silicon-carbide (SiC).

Spacers 131 and 133 may be disposed on sidewalls of the respective gate patterns 120. The gate insulating layer 123 may extend between each of the conductive patterns 121 and each of the spacers 131 and 133. The spacers 131 and 133 may include first spacers 131 and second spacers 133. The first spacers 131 may be disposed on sidewalls of the third conductive pattern 121c and may extend in the first direction X. The second spacers 133 may be disposed on sidewalls of the first conductive pattern 121a and on sidewalls of the second conductive patterns 121b. For example, the second spacers 133 may be disposed between the first conductive pattern 121a and the source/drain patterns SD adjacent to the first conductive pattern 121a and between the second conductive patterns 121b and the source/drain patterns SD adjacent to the second conductive patterns 121b. The second spacers 133 may be disposed between the second channel patterns 110b to be vertically spaced apart from each other. The second spacers 133 may be disposed to be spaced apart from each other in the second direction Y. As an example, a width W1 of each of the second channel patterns 110b may be substantially equal to a sum of a width W2 of each of the gate patterns 120 in the second direction Y and widths W3 of a pair of the first and second spacers 131 and 133 (W1=W2+W3+W3). The first and second spacers 131 and 133 may include, for example, a silicon oxide layer, a silicon nitride layer and/or a silicon oxynitride layer.

A buried insulating layer 140 may be disposed between the gate patterns 120 adjacent in the second direction Y and between the source/drain patterns SD adjacent in the first direction X. A top surface of the buried insulating layer 140 may be substantially coplanar with top surfaces of the gate patterns 120. The buried insulating layer 140 may include, for example, a silicon oxide layer, a silicon nitride layer and/or a silicon oxynitride layer.

An interlayer insulating layer 150 may be disposed on the gate patterns 120 and the buried insulating layer 140. The interlayer insulating layer 150 may include, for example, a silicon oxide layer, a silicon nitride layer and/or a silicon oxynitride layer. Contact plugs 160 may be disposed on the source/drain patterns SD. The contact plugs 160 may pass through the interlayer insulating layer 150 and the buried insulating layer 140 to contact the respective source/drain patterns SD. The contact plugs 160 may include, for example, at least one of metal nitride (e.g., TiN, TaN, AlN, WN and/or MoN), metal (e.g., W, Al, or Cu) and metal silicide.

Figure 4:
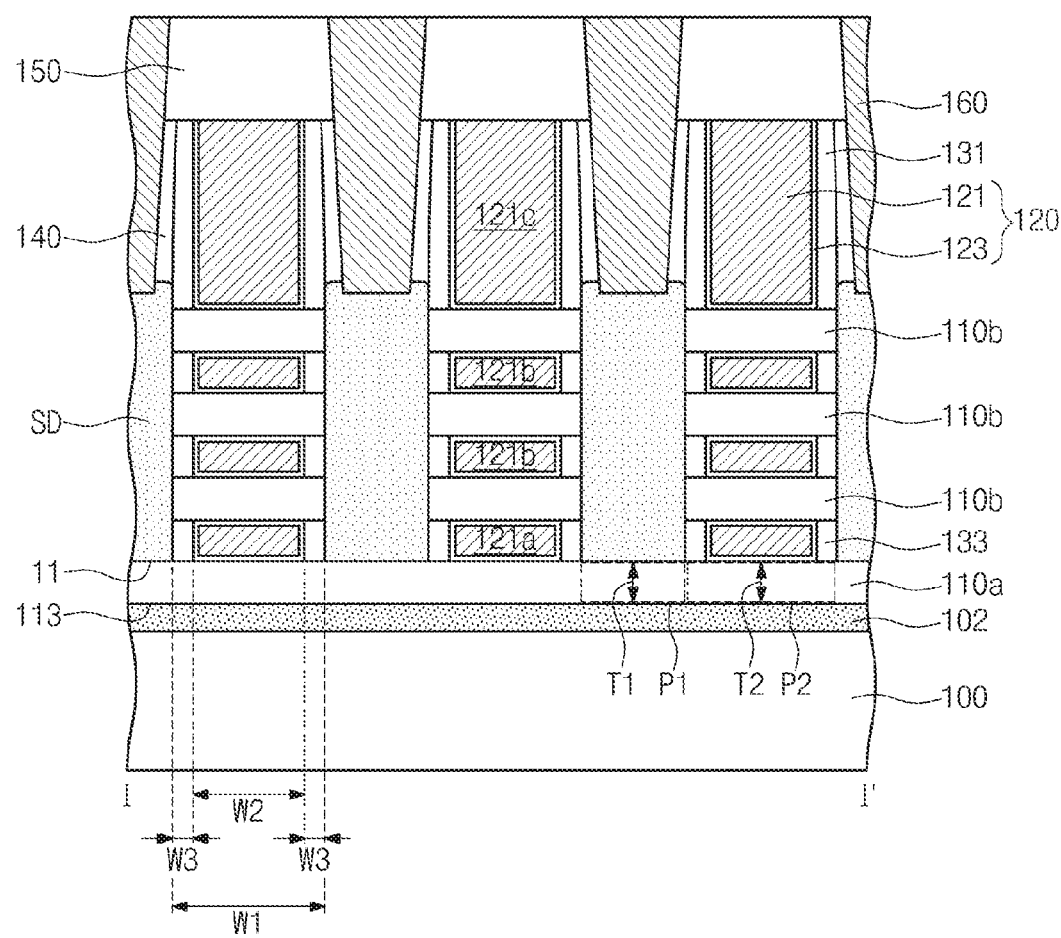
FIG. 4 is a cross-sectional view taken along line I-I' of FIG. 1 according to other example embodiments.

FIG. 4 illustrates a semiconductor device according to another example embodiment and is a cross-sectional view taken along line I-I' of FIG. 1. The same reference numerals or the same reference designators are used to denote the same elements as in FIGS. 1 to 3, and repeated descriptions thereof are omitted for brevity.

Referring to FIG. 4, the source/drain patterns SD may be disposed on the first channel patterns 110a and between the second channel patterns 110b adjacent in the second direction Y. A thickness T1 of the first parts P1 of the first channel patterns 110a may be substantially equal to a thickness T2 of the second parts P2 of the first channel patterns 110a (T1=T2). Top surfaces of the first parts P1 of the first channel patterns 110a may be substantially coplanar with top surfaces of the second parts P2 of the first channel patterns 110a. The bottom surfaces 113 of the first channel patterns 110a may be positioned at a lower level than the bottom surfaces 11 of the source/drain patterns SD relative to the top surface of the substrate 100.

Figure 5:
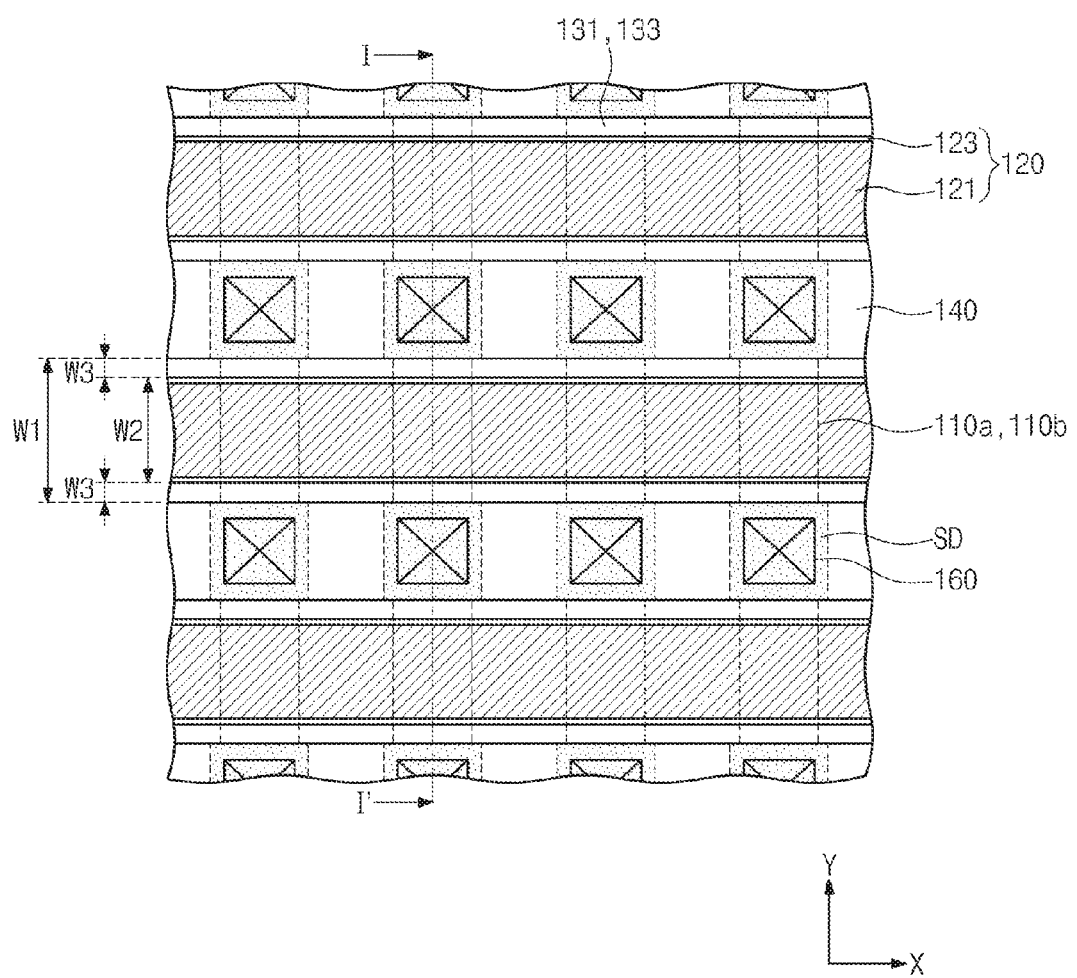
FIG. 5 is a plan view illustrating a semiconductor device according to an example embodiment.
Figure 6:
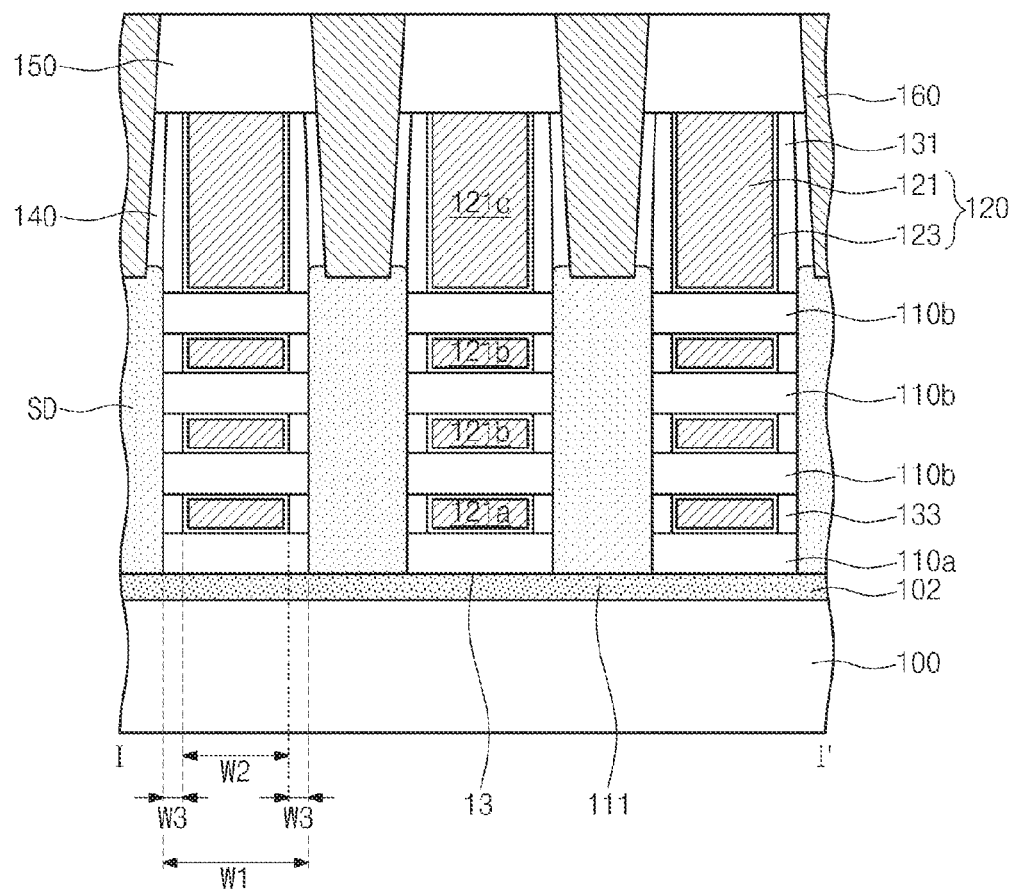
FIG. 6 is a cross-sectional view taken along line I-I' of FIG. 5.

FIG. 5 is a plan view illustrating a semiconductor device according to an example embodiment. FIG. 6 is a cross-sectional view taken along line I-I' of FIG. 5. The same reference numerals or the same reference designators are used to denote the same elements as in FIGS. 1 to 3, and repeated descriptions thereof are omitted for brevity.

Referring to FIGS. 5 and 6, the source/drain patterns SD may pass through the first channel patterns 110a. Thus, the source/drain patterns SD may contact the insulating layer 102. The first channel patterns 110a may be spaced apart from each other in the first direction X and the second direction Y. As an example, a width of the first channel patterns 110a in the second direction Y may be substantially equal to a width of the second channel patterns 110b in the second direction Y. Bottom surfaces 13 of the first channel patterns 110a may be positioned at substantially the same level as bottom surfaces 111 of the source/drain patterns SD relative to the top surface of the substrate 100.

FIGS. 7A, 8A, 9A, 10A, 11A, and 13A are plan views illustrating stages of a method of manufacturing a semiconductor device according to an example embodiment. FIGS. 7B, 8B, 9B, 10B, 11B, 12A, and 13B are cross-sectional views taken along lines I-I' of 7A, 8A, 9A, 10A, 11A and 13A, respectively. FIGS. 7C, 8C, 9C, 10C, 11C, 12B, 13C are cross-sectional views taken along lines II-II' of 7A, 8A, 9A, 10A, 11A and 13A, respectively.

Figure 7A:
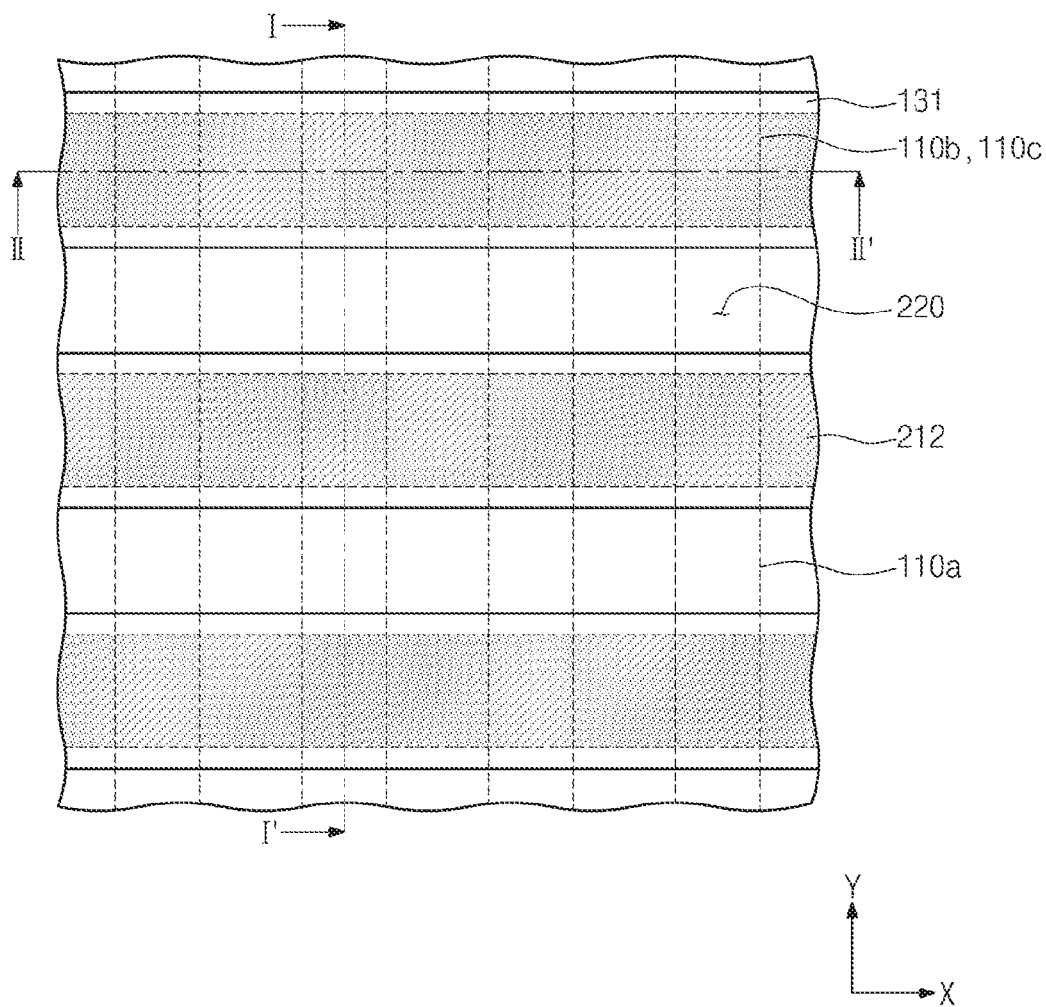
FIGS. 7A, 8A, 9A, 10A, 11A, and 13A are plan views illustrating stages of a method of manufacturing a semiconductor device according to an example embodiment.
Figure 7B:
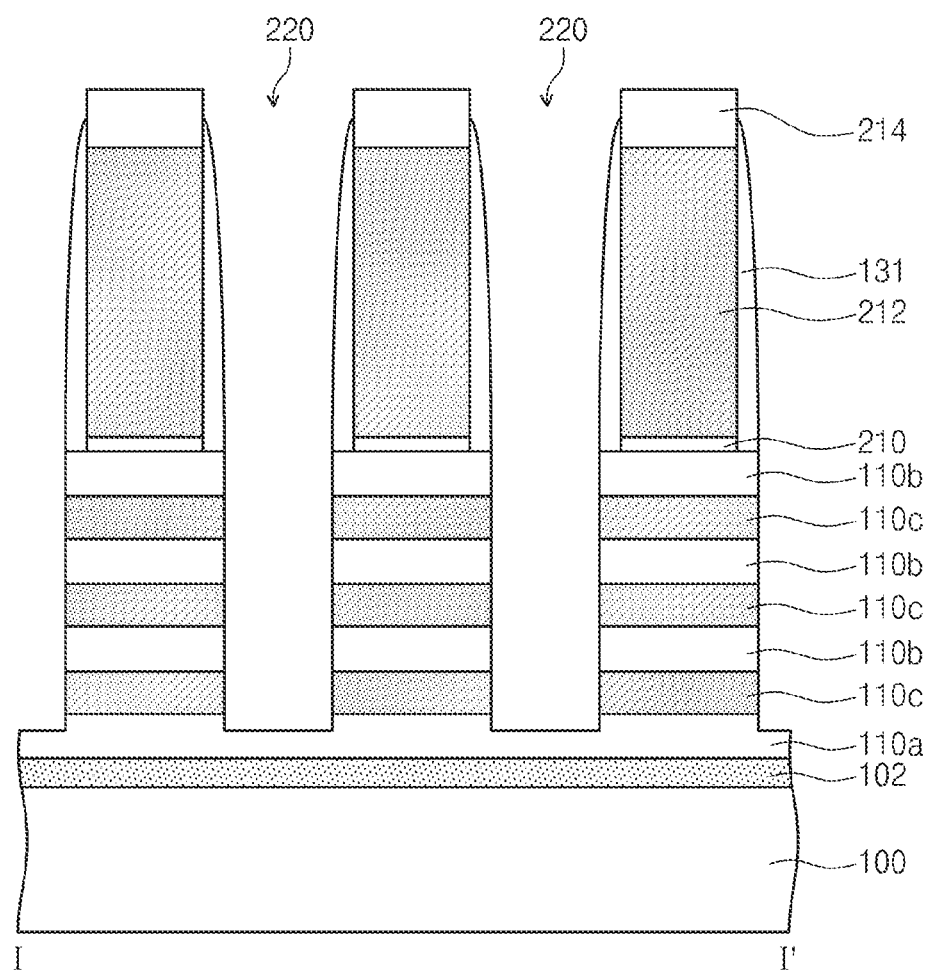
FIGS. 7B, 8B, 9B, 10B, 11B, 12A, and 13B are cross-sectional views taken along lines I-I' of 7A, 8A, 9A, 10A, 11A and 13A, respectively.
Figure 7C:
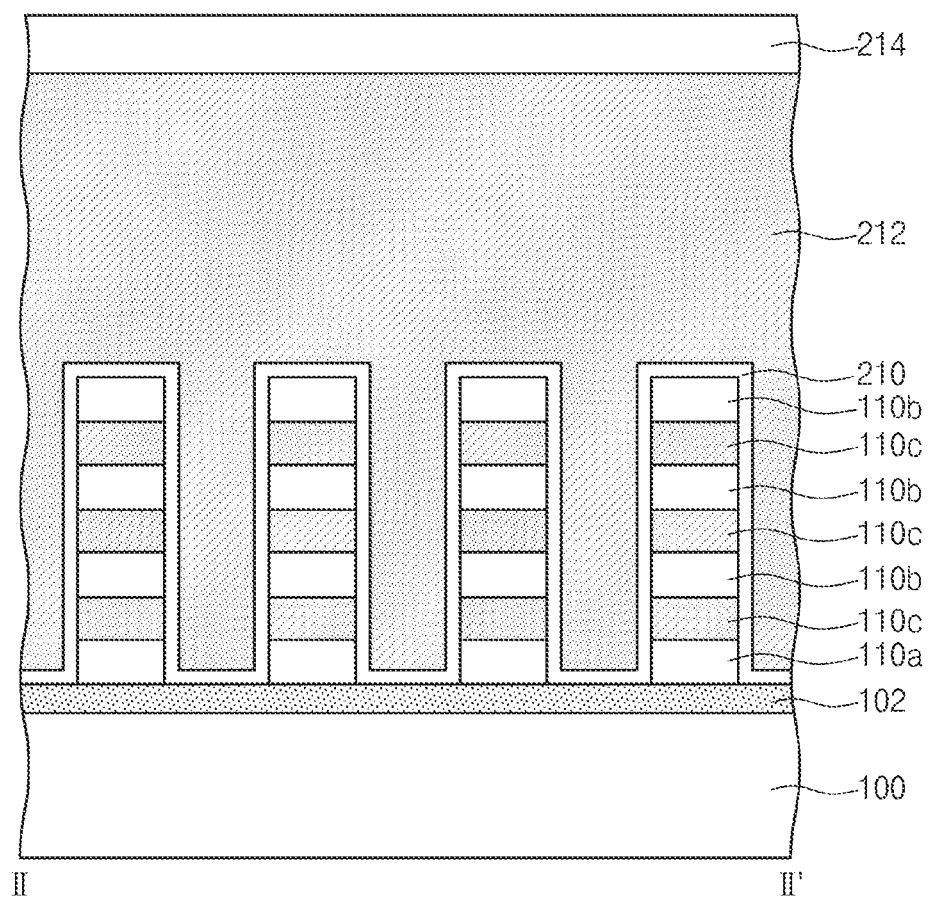
FIGS. 7C, 8C, 9C, 10C, 11C, 12B, 13C are cross-sectional views taken along lines II-II' of 7A, 8A, 9A, 10A, 11A and 13A, respectively.

Referring to FIGS. 7A, 7B and 7C, an insulating layer 102 and first channel patterns 110a may be sequentially formed on a substrate 100. Sacrificial patterns 110c and second channel patterns 110b may be formed to be repeatedly and alternately stacked on the respective first channel patterns 110a. The substrate 100 may include a silicon substrate, a silicon-germanium substrate, a germanium substrate, or a single crystal epitaxial layer grown from a single crystal silicon substrate. The insulating layer 102 may include, for example, a silicon oxide layer. The insulating layer 102 may include, for example, a silicon oxide layer.

The first channel patterns 110a may be formed to be spaced apart from each other in a first direction X and may extend in a second direction Y. The sacrificial patterns 110c and the second channel patterns 110b may be formed to be respectively spaced apart from each other in the first direction X and the second direction Y. The sacrificial patterns 110C may include silicon germanium (SiGe), and the second channel patterns 110b may include silicon (Si).

The formation of the first channel patterns 110a, the sacrificial patterns 110c and the second channel patterns 110b may include forming a first semiconductor layer including silicon on the insulating layer 102, repeatedly and alternately forming, on the first insulating layer, second semiconductor layers including silicon germanium and third semiconductor layers including silicon, and patterning the first semiconductor layer, the second semiconductor layers and the third semiconductor layers to form first semiconductor patterns, second semiconductor patterns and third semiconductor patterns that are respectively spaced apart from each other in the first direction X and extend in the second direction Y.

Further, the formation of the first channel patterns 110a, the sacrificial patterns 110c and the second channel patterns 110b may include forming sacrificial insulating patterns 210 to conformally cover top surfaces of uppermost third semiconductor patterns, portions of a top surface of the insulating layer 102 exposed by spaces between the first semiconductor patterns adjacent in the first direction X, between the second semiconductor patterns adjacent in the first direction X and between the third semiconductor patterns adjacent in the first direction X and sidewalls of the first through third semiconductor patterns exposed by the spaces, forming sacrificial conductive patterns 212 on the sacrificial insulating patterns 210 to fill the spaces, forming second mask patterns 214 on the sacrificial conductive patterns 212, forming first spacers 131 to cover sidewalls of the sacrificial insulating patterns 210, the sacrificial conductive patterns 212 and the second mask patterns 214, and patterning the first through third semiconductor patterns using the second mask patterns 214, the sacrificial conductive patterns 212 and the first spacers 131 as an etching mask.

Trenches 220 may be formed between the sacrificial patterns 110c adjacent in the second direction Y, between the second channel patterns 110b adjacent in the second direction Y and between the spacers 131 adjacent in the second direction Y.

The sacrificial insulating patterns 210 may include an insulating material (e.g., silicon oxide, silicon nitride or silicon oxynitride). The sacrificial conductive patterns 212 may include, for example, polysilicon. The second mask patterns 214 may include an insulating material (e.g., silicon oxide, silicon nitride, or silicon oxynitride). The first spacers 131 may include, for example, a silicon oxide layer, a silicon nitride layer and/or a silicon oxynitride layer.

Figure 8A:
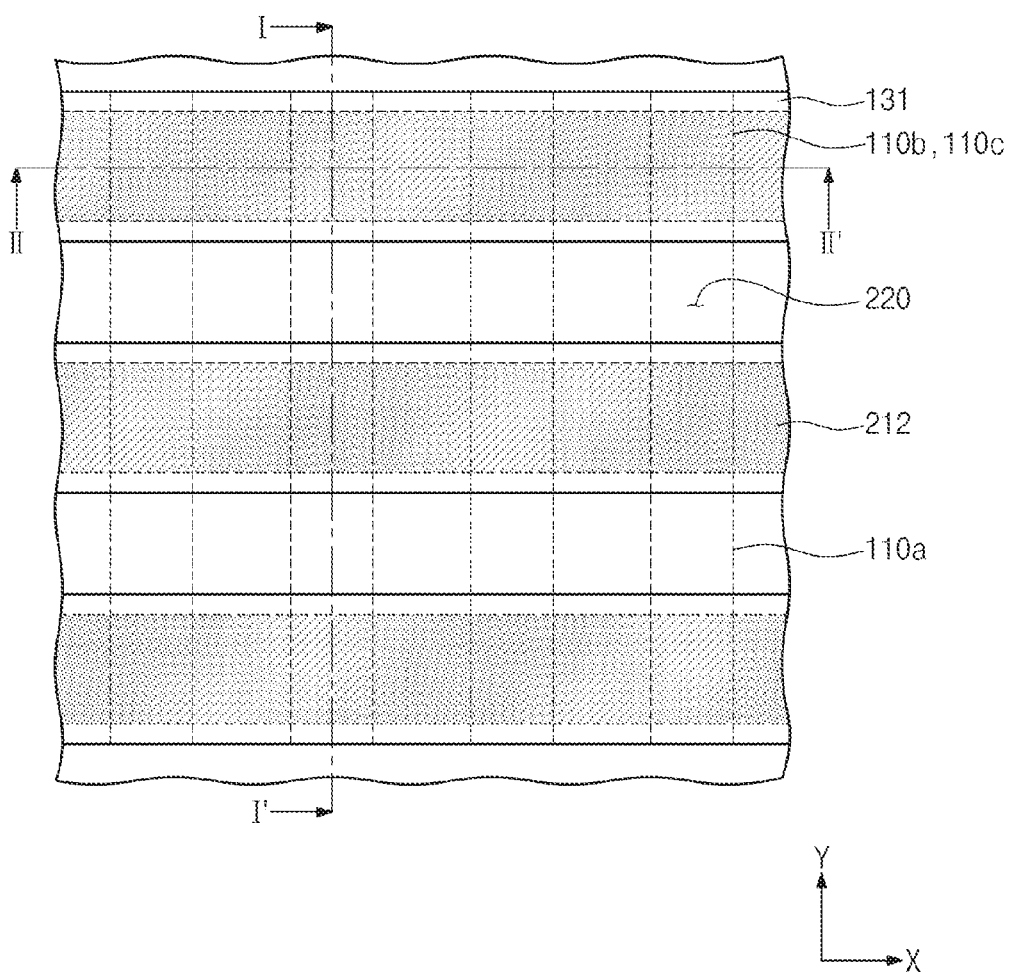
Figure 8B:
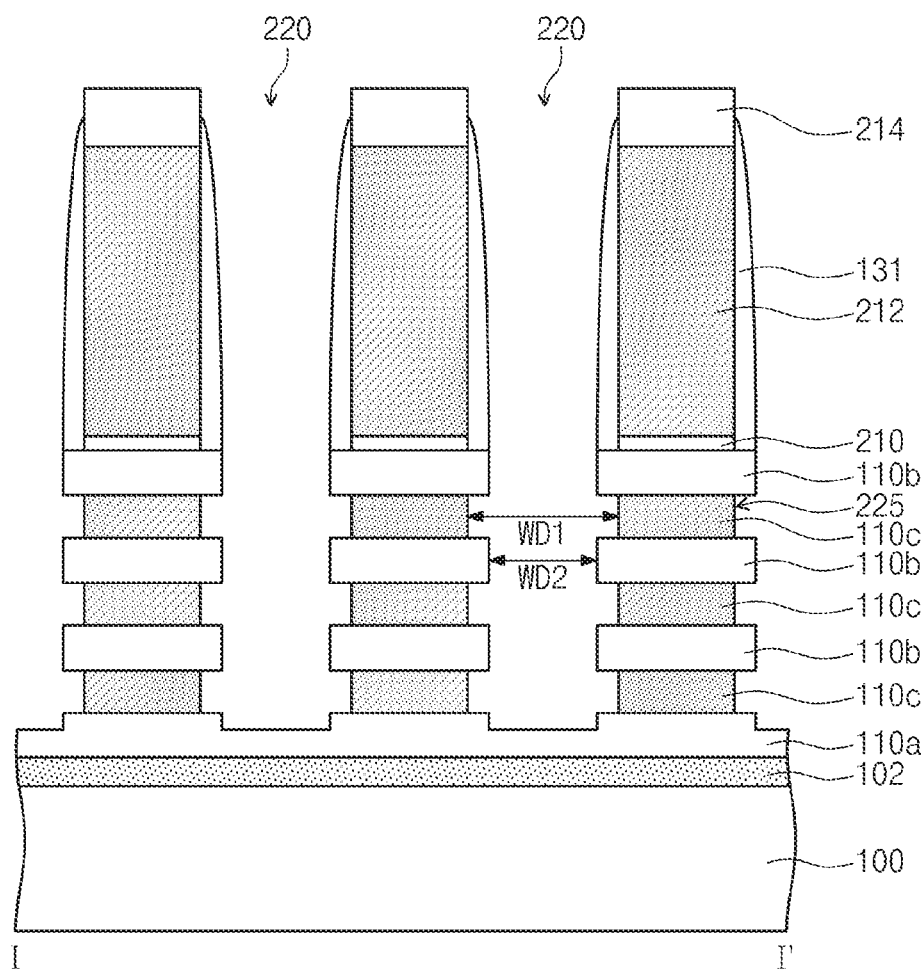
Figure 8C:
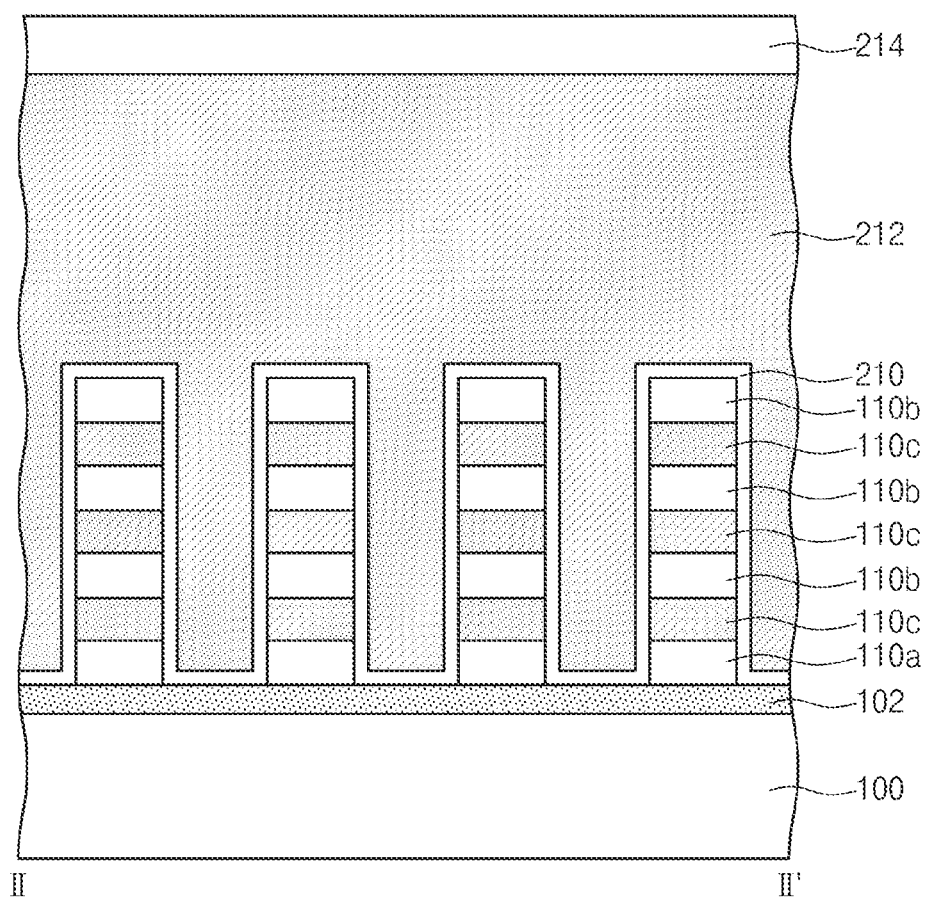

Referring to FIGS. 8A, 8B and 8C, portions of the sacrificial patterns 110c exposed by the trenches 220 may be etched such that the sacrificial patterns 110c are recessed. Accordingly, recess regions 225 may each be formed between each of the first channel patterns 110a and each of the lowermost second channel patterns 110b that are vertically adjacent to each other and between the second channel patterns 110b that are vertically adjacent to each other. As an example, by the etching process, a width WD1 of the trenches 220 between the sacrificial patterns 110c may be greater than a width WD2 of the trenches 220 between the second channel patterns 110b (WD1>WD2). The portions of the sacrificial patterns 110c may be removed using an etch recipe having an etch selectivity with respect to the first channel patterns 110a and the second channel patterns 110b. For example, the etch selectivity of the sacrificial patterns 110c may be about 10 times higher than that of the first and second channel patterns 110a and 110b. Accordingly, while the portion of the sacrificial patterns 110c are etched, the first channel patterns 110a and the second channel patterns 110b may not be etched.

Figure 9A:
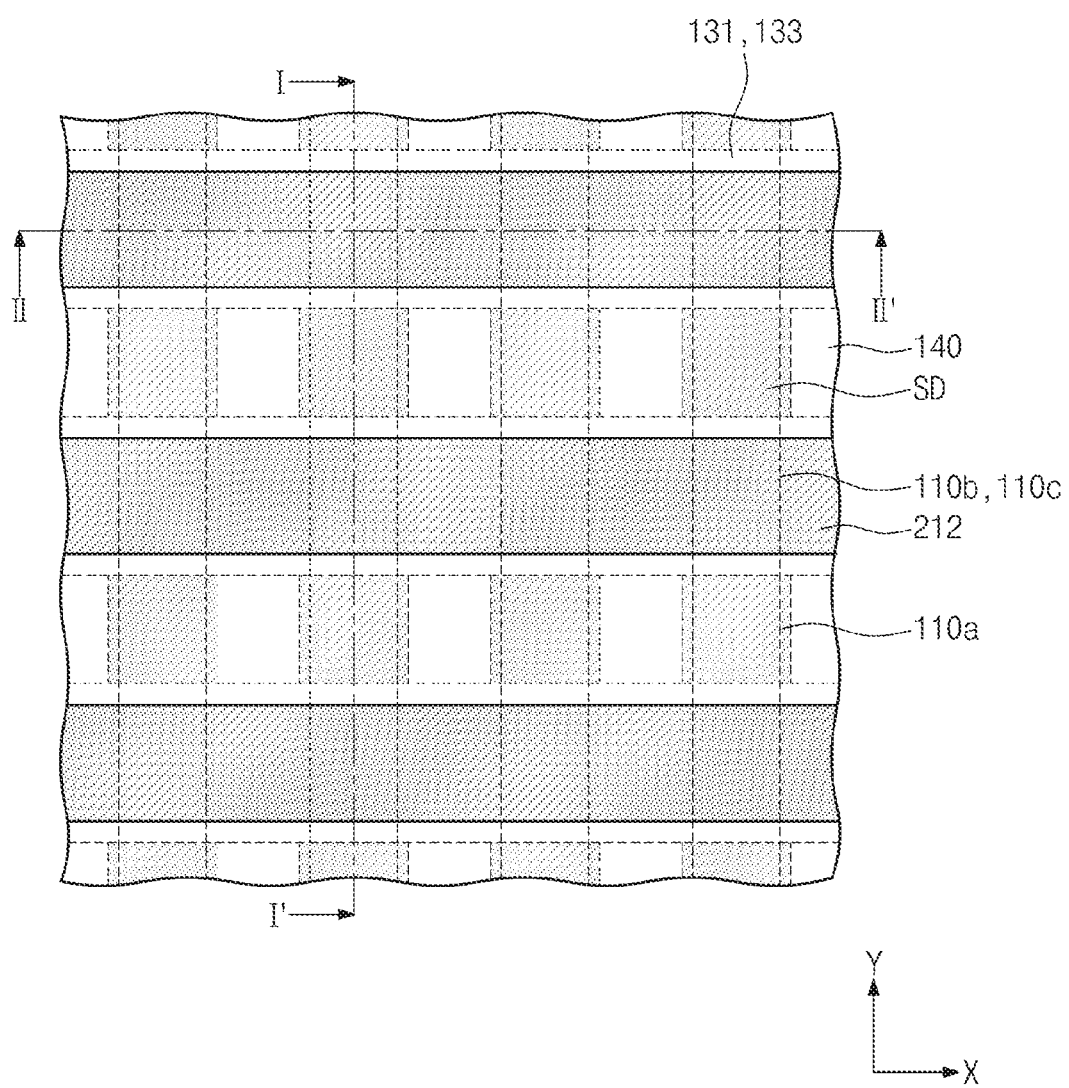
Figure 9B:
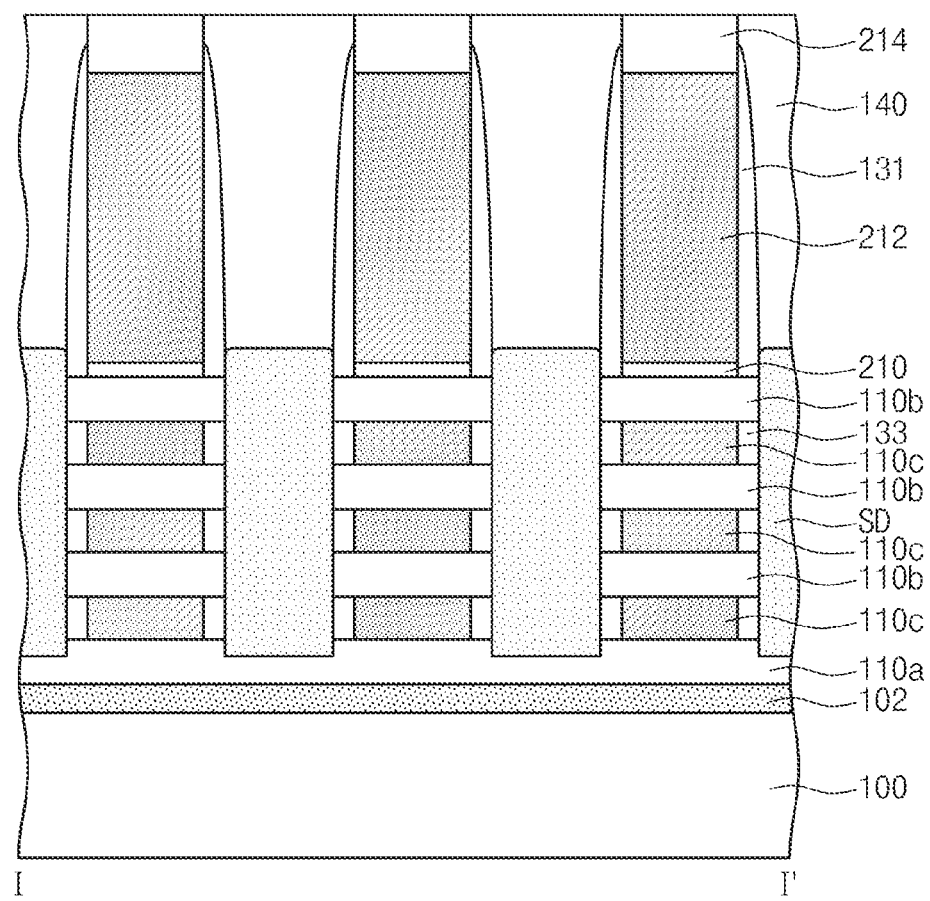
Figure 9C:
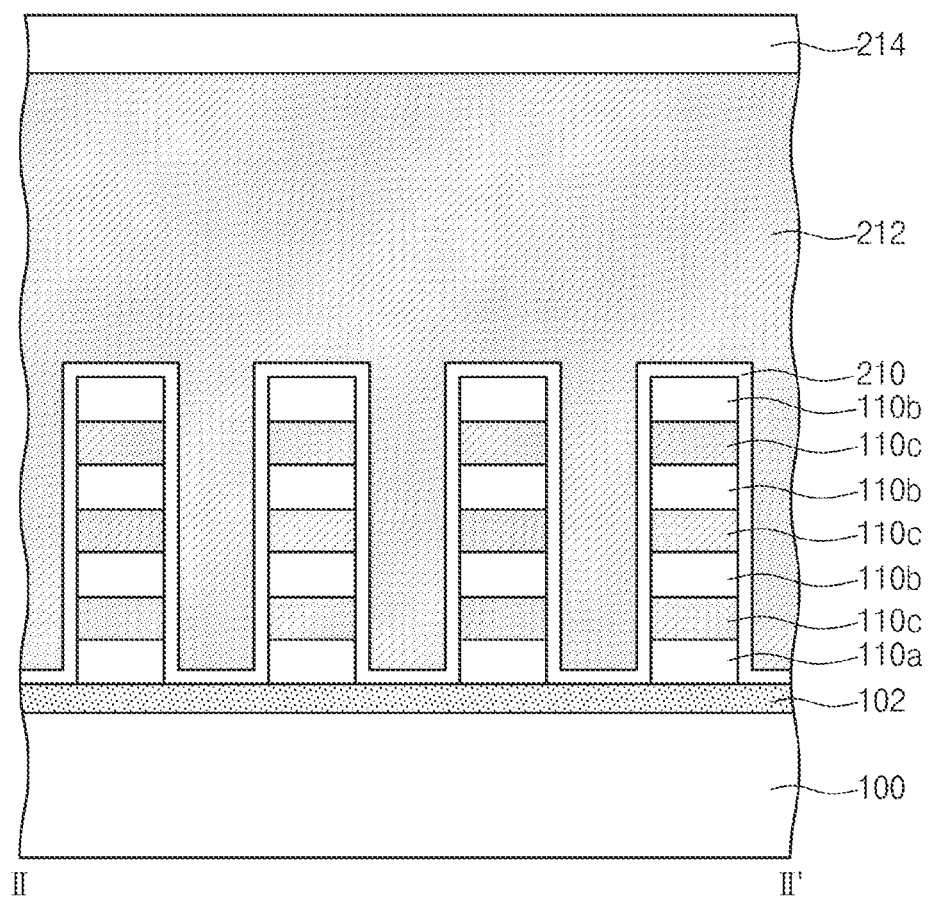

Referring to FIGS. 9A, 9B and 9C, second spacers 133 may be formed on the sidewalls of the sacrificial patterns 110c. The second spacers 133 may be selectively or locally formed in the recess regions 225 by forming a spacer layer to cover top surfaces and sidewalls of the first channel patterns 110a, sidewalls of the second channel patterns 110b, outer sidewalls of the first spacers and the top surfaces of the second mask patterns 214 that are exposed by the trenches 220 and to fill the recess regions 225, and performing an etch process (e.g., an etch-back process) on the spacer layer. By the etch process, the top surfaces and the sidewalls of the first channel patterns 110a, the sidewalls of the second channel patterns 110b, the outer sidewalls of the first spacers 131 and the top surfaces of the second mask patterns 214 may be exposed.

Source/drain patterns SD may be formed in the trenches 220. The source/drain patterns SD may be formed by performing an epitaxial growth process using the top surfaces and the sidewalls of the first channel patterns 110a, the sidewalls of the second channel patterns 110b that are exposed by the tranches 220 as a seed. In other words, the source/drain patterns SD may include an epitaxial layer. As an example, top surfaces of the source/drain patterns SD may be positioned at a lower level than top surfaces of the sacrificial conductive patterns 212 relative to a top surface of the substrate 100. The source/drain patterns SD may include impurities. The impurities may include, for example, at least one of phosphorus (P), carbon (C), boron (B) and tin (Sn).

According to the example embodiment, since the first channel patterns 110a exposed at bottom surfaces and sidewalls adjacent to the bottom surfaces, of the trenches 220 is formed of a semiconductor material, the source/drain patterns SD may be easily formed by growing the epitaxial layer from the first channel patterns 110a.

Buried insulating layer 140 may be formed on the source/drain patterns SD. The buried insulating layer 140 may fill the trenches 220 between the sacrificial conductive patterns 212 and spaces between the source/drain patterns SD adjacent in the first direction X. For example, the buried insulating layer 140 may be formed by forming an insulating layer to fill the trenches 220 between the sacrificial patterns 212 and the spaces between the source/drain patterns SD adjacent in the first direction X and to cover the top surfaces of the second mask patterns 214, and performing a planarization process on the insulating layer until the top surfaces of the second mask patterns 214 are exposed. The buried insulating layer 140 may include an insulating material (e.g., silicon oxide, silicon nitride and/or silicon oxynitride).

Figure 10A:
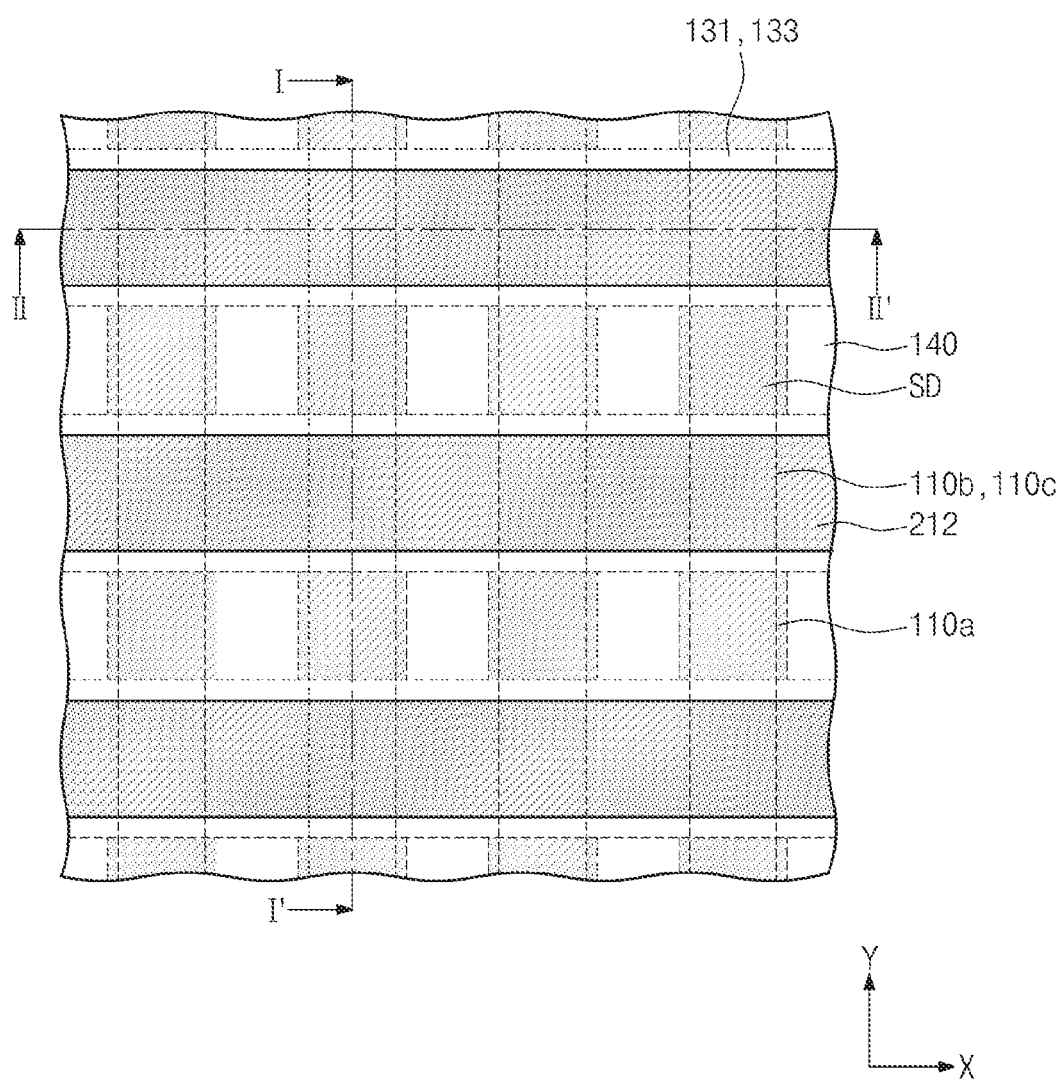
Figure 10B:
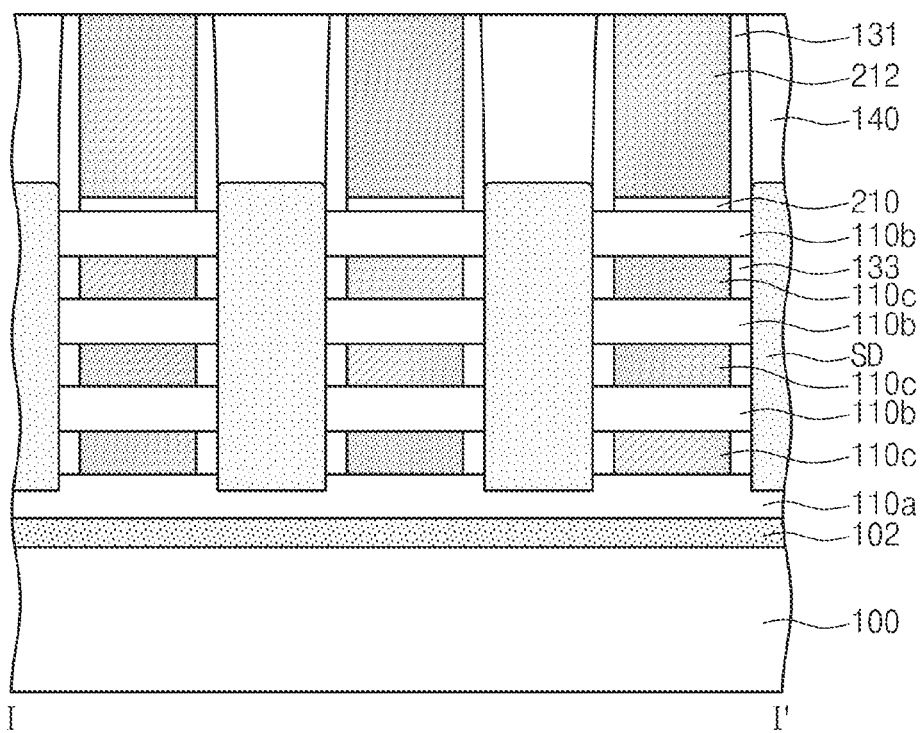
Figure 10C:
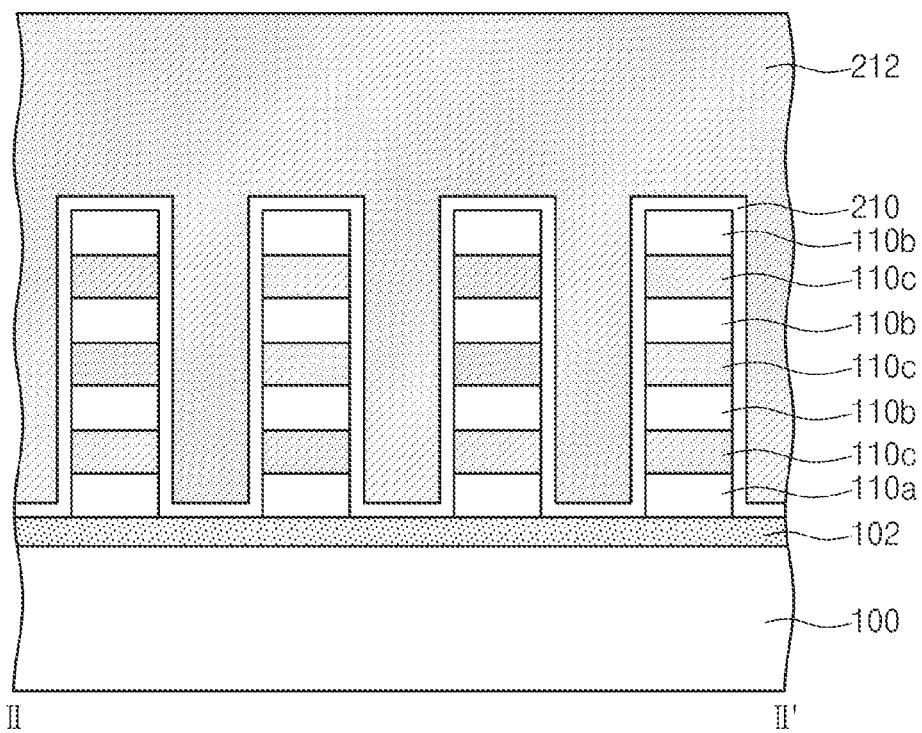

Referring to FIGS. 10A, 10B and 10C, an upper portion of the buried insulating layer 140 and upper portions of the second mask patterns 214 may be removed to expose the top surfaces of the sacrificial conductive patterns 212. Top surfaces of the first spacers 131 may also be exposed by the removal process. The removal process may be performed using, for example, a chemical mechanical polishing process. As an example, by the removal process, a height from bottom surfaces of the sacrificial conductive patterns 212 to the top surfaces of the sacrificial conductive patterns 212 may be reduced. The top surfaces of the sacrificial conductive patterns 212 may be coplanar with a top surface of the buried insulating layer 140.

Figure 11A:
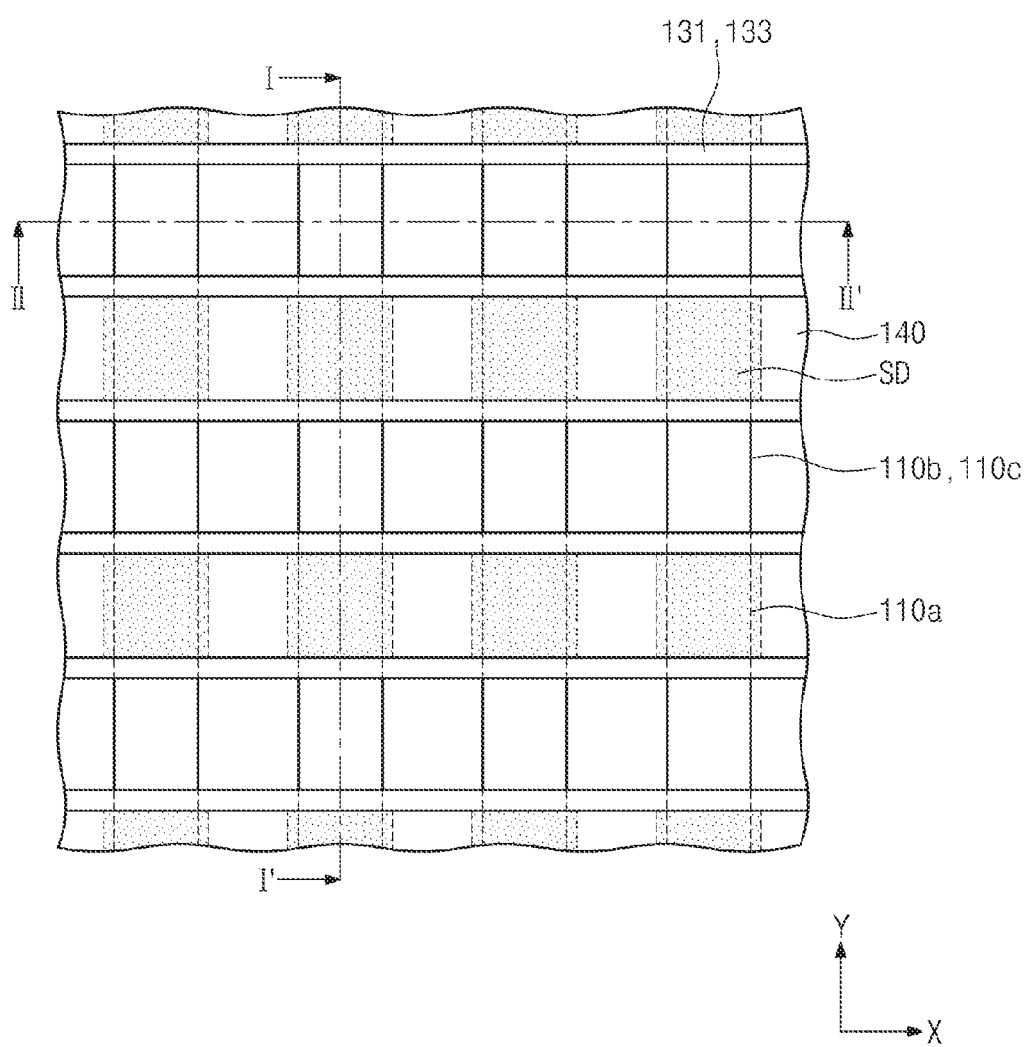
Figure 11B:
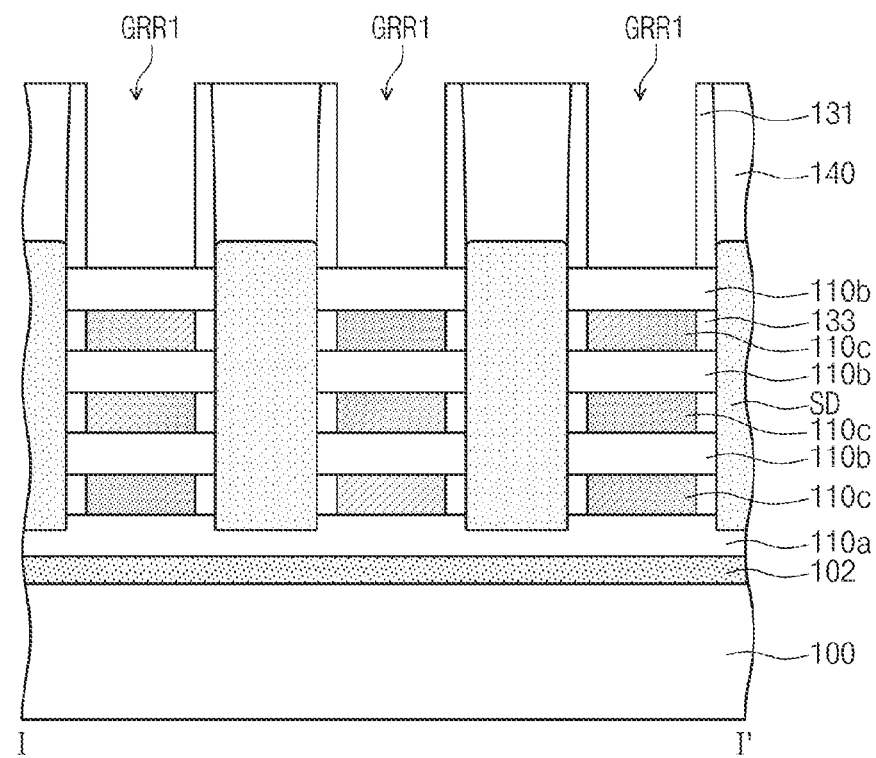
Figure 11C:
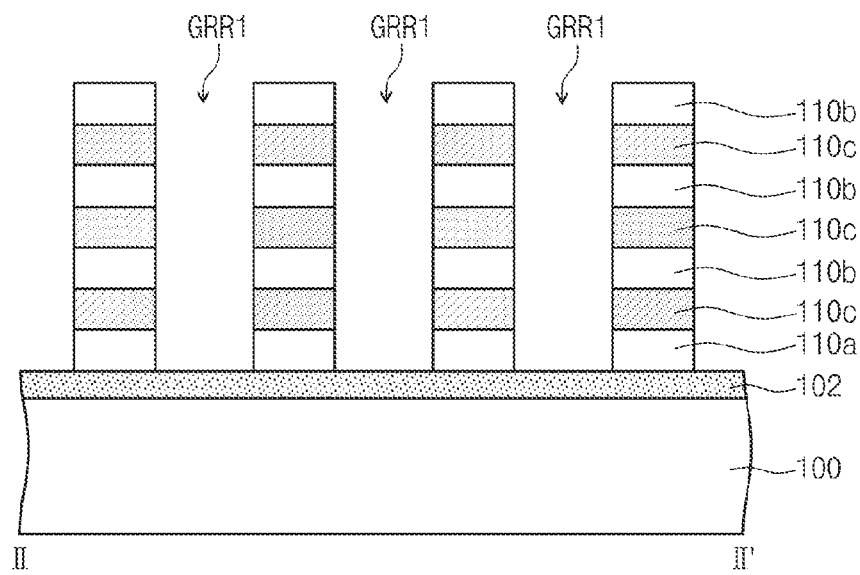

Referring to FIGS. 11A, 11B and 11C, the sacrificial conductive patterns 212 and the sacrificial insulating patterns 210 may be sequentially removed to form a first gap region GRR1. Inner sidewalls of the first spacers 131, the top surfaces of the uppermost second channel patterns 110b, the sidewalls of the first and second channel patterns 110a and 110b facing in the first direction X, and portions of the top surface of the insulating layer 102 may be exposed by the first gap region GRR1. The sacrificial conductive patterns 212 and the sacrificial insulating patterns 210 may be removed using an etch recipe having an etch selectivity with respect to the first spacers 131, the second channel patterns 110b and the buried insulating layer 140.

Figure 12A:
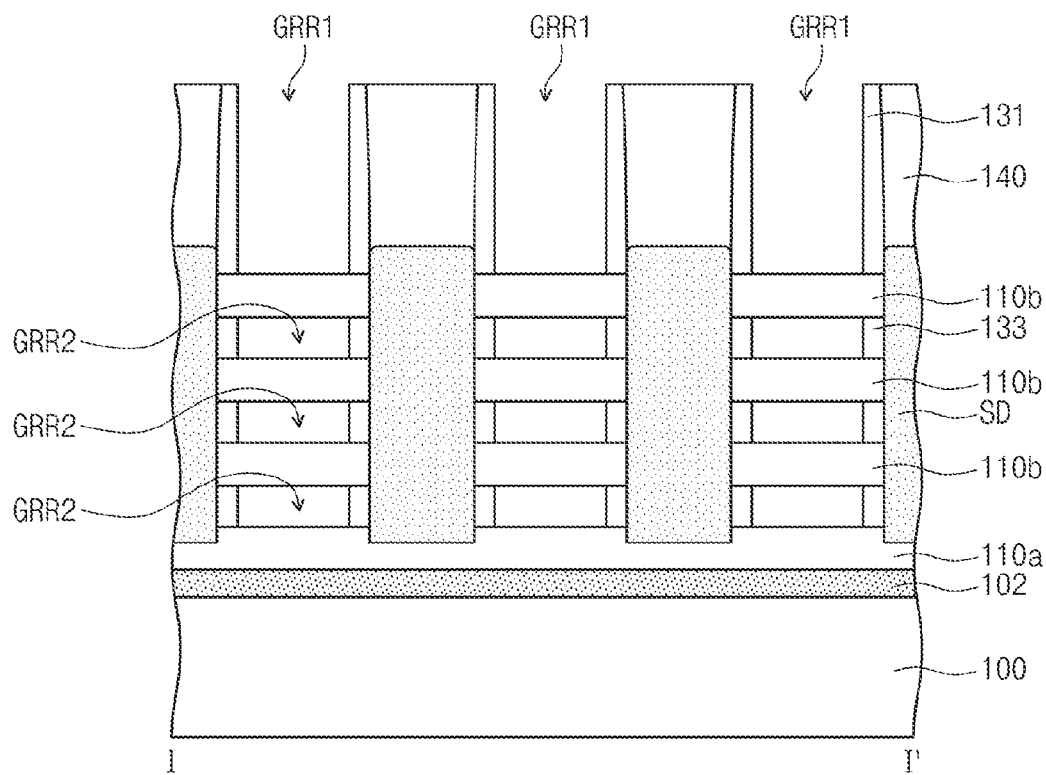
Figure 12B:
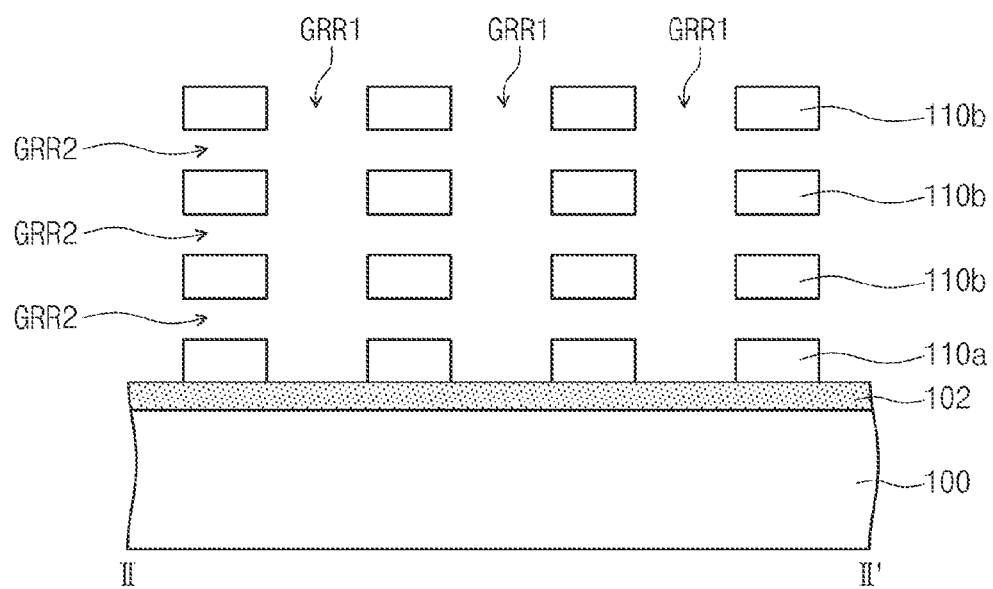

Referring to FIGS. 11A, 12A and 12B, the sacrificial patterns 110c exposed by the first gap region GRR1 may be removed to form second gap regions GRR2 between the first channel patterns 110a and the lowermost second channel patterns 110b vertically adjacent to the first channel patterns 110a and between the second channel patterns 110b vertically adjacent to each other. The second gap regions GRR2 may expose portions of top surfaces of the first channel patterns 110a, portions of top surfaces and bottom surfaces of the second channel patterns 110b and inner sidewalls of the second spacers 133. The sacrificial patterns 110c may be removed using an etch recipe having an etch selectivity with respect to the first and second channel patterns 110a and 110b, the first and second spacers 131 and 133 and the buried insulating layer 140. As an example, the etch selectivity of the sacrificial patterns 110c may be about 10 times higher than that of the first and second channel patterns 110a and 110b.

Figure 13A:
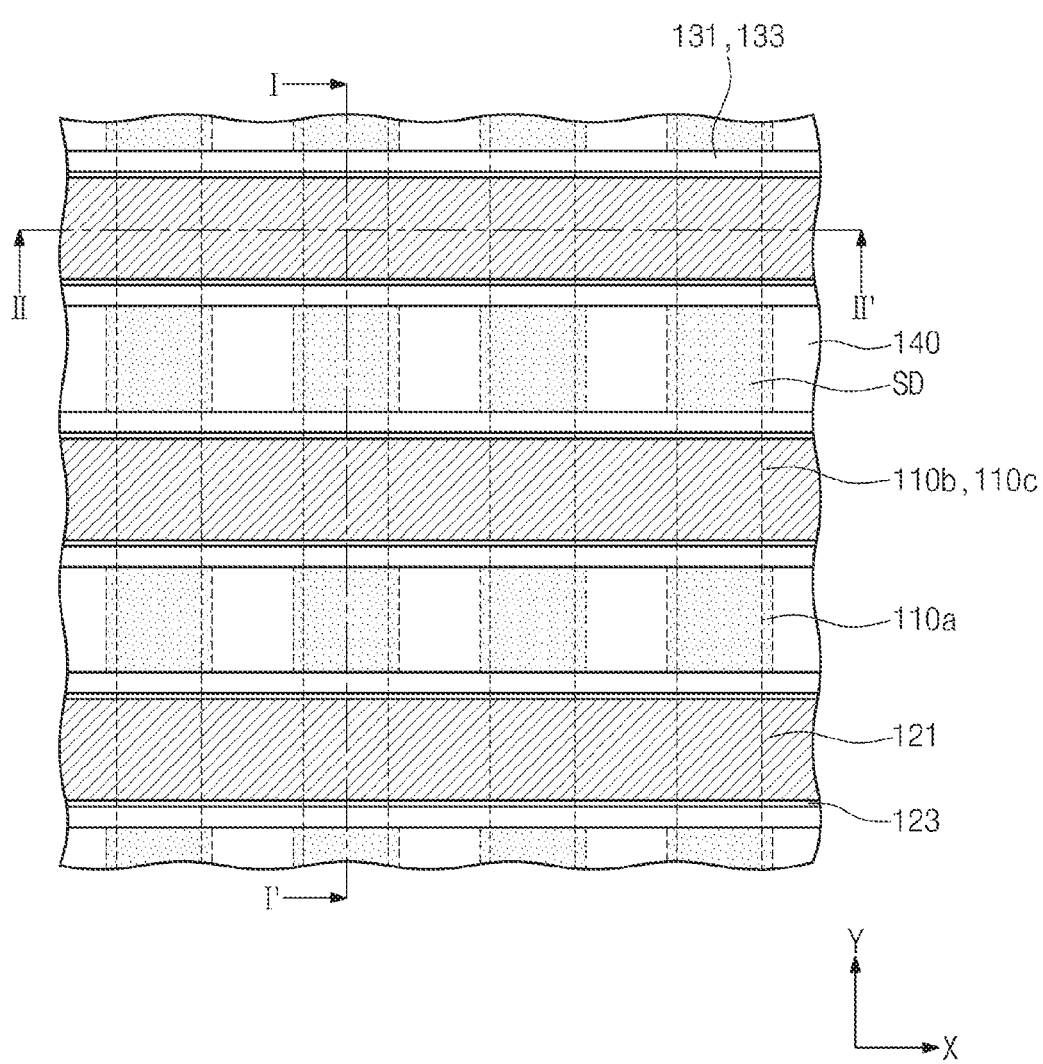
Figure 13B:
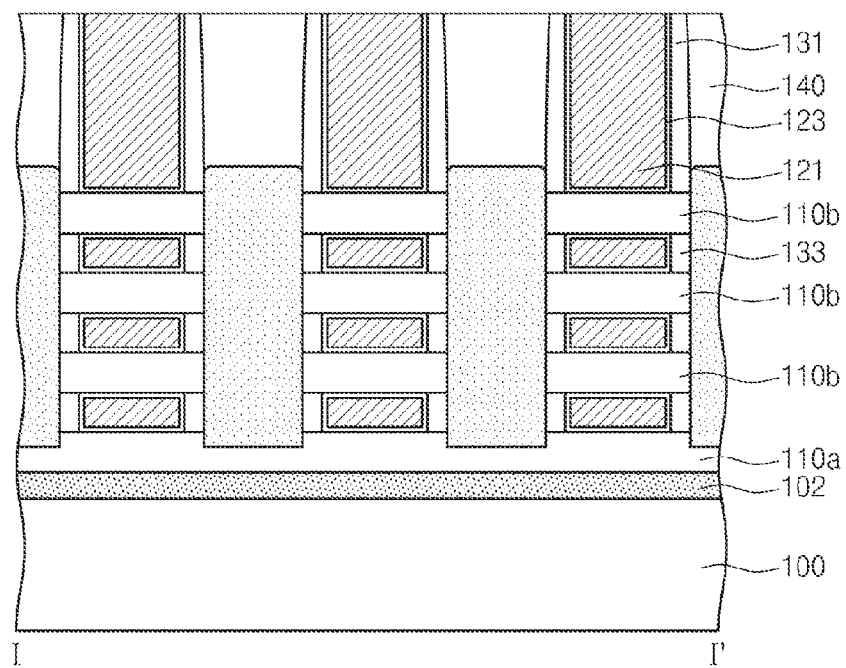
Figure 13C:
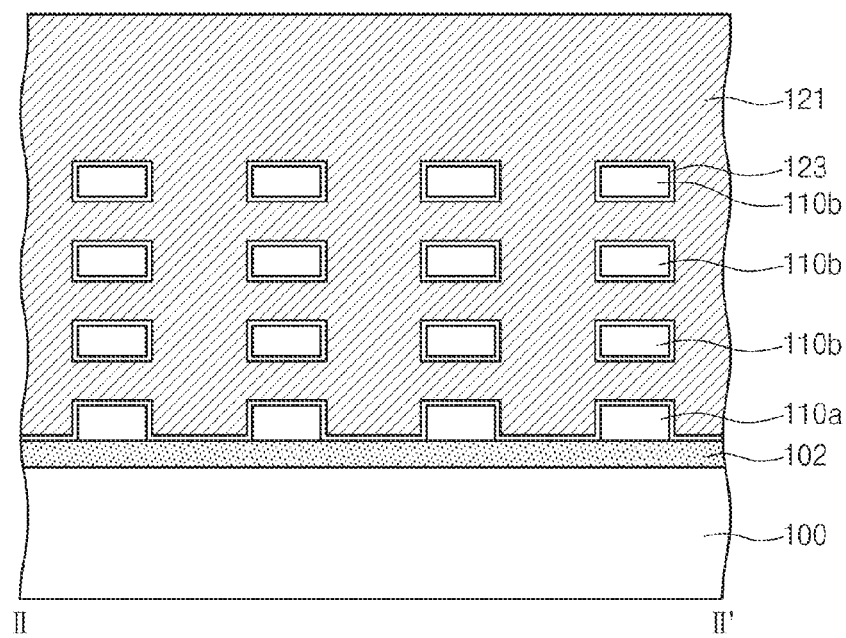

Referring to FIGS. 13A, 13B and 13C, a gate insulating layer 123 and conductive patterns 121 may be sequentially formed in the first gap region GRR1 and the second gap regions GRR2. The gate insulating layer 123 and conductive patterns 121 may be formed by forming an insulating layer to conformally cover portions of the top surface of the insulating layer 102, the portions of the top surfaces of the first channel patterns 110a, the portions of the top surfaces of the second channel patterns 110b, the portions of the bottom surfaces of the second channel patterns 110b, the inner sidewalls of the first spacers 133, the inner sidewalls and the top surfaces of the first spacers 131 and the top surfaces of the buried insulating layer 140, forming a conductive layer including metal to cover the insulating layer and to fill the first and second gap regions GRR1 and GRR2, and etching the insulating layer and the conductive layer by performing a chemical mechanical polishing process until the top surface of the buried insulating layer 140 is exposed.

Referring again to FIGS. 1, 2 and 3, an interlayer insulating layer 150 may be formed to cover the gate insulating layer 123, the conductive patterns 121, the first spacers 131 and the buried insulating layer 140. The interlayer insulating layer 150 may include an insulating material (e.g., silicon oxide, silicon nitride and/or silicon oxynitride). Contact plugs 160 may be disposed on the respective source/drain patterns SD. The contact plugs 160 may be formed by etching a portion of the interlayer insulating layer 150 and a portion of the buried insulating layer 140 to form contact holes and filling the contact holes with a metallic material.

According to the example embodiments of the inventive concepts, the first channel patterns 110a corresponding to lowermost ones of the channel patterns and formed of a semiconductor material may be disposed to contact the insulating layer 102 provided on the substrate 100 and may be exposed at the bottom surface and sidewalls adjacent to the bottom surface, of the trenches in which the source/drain patterns SD are formed. Accordingly, the source/drain patterns SD may be easily formed by growing an epitaxial layer from the first channel patterns 110a using the first channel patterns 110a as a seed.

While example embodiments of the inventive concepts have been particularly shown and described with reference to example embodiments thereof, it will be understood by those of ordinary skill in the art that various changes in form and details may be made therein without departing from the spirit and scope of the example embodiments as defined by the following claims.

What is claimed is:

1. A semiconductor device, comprising:
   an insulating layer on a substrate;
   a first channel pattern on the insulating layer, the first channel pattern contacting the insulating layer;
   second channel patterns on the first channel pattern, the second channel patterns being horizontally spaced apart from each other;
   a gate pattern on the insulating layer, the gate pattern surrounding the second channel patterns; and
   a source/drain pattern between the second channel patterns.

2. The device according to claim 1, wherein the gate pattern comprises:
   a conductive pattern on a top surface and sidewalls of the first channel pattern and on top surfaces, bottom surfaces and sidewalls of the second channel patterns; and
   a gate insulating layer between the conductive pattern and the first and second channel patterns.

3. The device according to claim 2, wherein the gate insulating layer extends on a top surface of the insulating layer.

4. The device according to claim 1, further comprising:
   spacers between the gate pattern and the source/drain pattern, the spacers being vertically spaced apart from each other with a respective one of the second channel patterns interposed therebetween.

5. The device according to claim 4, wherein the spacers include,
   a first spacer that is selectively between the first channel pattern and lowermost ones of the second channel patterns and between the second channel patterns, and
   a second spacer on uppermost ones of the second channel patterns, the second spacer extending in a direction.

6. The device according to claim 1, wherein the first channel pattern is interposed between the insulating layer and the source/drain pattern.

7. The device according to claim 6, wherein the first channel pattern includes a first part under the source/drain pattern and a second part under the second channel patterns, wherein a thickness of the first part is less than a thickness of the second part.

8. The device according to claim 6, wherein the first channel pattern includes a first part under the source/drain pattern and a second part under the second channel patterns, wherein a thickness of the first part is substantially equal to a thickness of the second part.

9. The device according to claim 1, wherein the source/drain pattern contacts the first channel pattern and the second channel patterns.

10. A semiconductor device, comprising:
an insulating layer on a substrate;
channel patterns on the insulating layer and being vertically spaced apart from each other, the channel patterns including a first channel pattern corresponding to a lowermost one of the channel patterns relative to the insulating layer, and a second channel pattern on the first channel pattern, the first channel pattern contacting the insulating layer;
a gate pattern on the insulating layer, the gate pattern surrounding the second channel pattern; and
a source/drain pattern at a side of the gate pattern,
wherein a bottom surface of the first channel pattern is positioned at substantially the same level as a bottom surface of the source/drain pattern relative to a top surface of the substrate.

11. The device according to claim 10, wherein the source/drain pattern contacts the insulating layer.

12. The device according to claim 10, further comprising:
spacers on opposite sidewalls of the gate pattern,
wherein a sum of a thickness of the gate pattern and thicknesses of the spacers is substantially equal to a width of each of the first and second channel patterns.

13. The device according to claim 10, wherein a width of the first channel pattern is substantially equal to a width of the second channel pattern.

14. The device according to claim 10, wherein the gate pattern comprises:
a conductive pattern; and
a gate insulating layer between the conductive pattern and the first and second channel patterns,
wherein the conductive pattern is disposed on a top surface and sidewalls of the first channel pattern and on a top surface, a bottom surface and sidewalls of the second channel pattern.

15. A semiconductor device comprising:
a first channel pattern contacting an insulating layer;
a gate pattern on the first channel pattern;
a source/drain pattern at a side of the gate pattern; and
second channel patterns with gate-all-around structures on the second channel pattern,
wherein the source/drain pattern is on the first channel pattern such that the source/drain pattern does not contact the insulating layer.

16. The semiconductor device of claim 15, wherein the source/drain pattern contacts the insulating layer.

17. The semiconductor device of claim 15, wherein the gate pattern includes,
a conductive pattern; and
a gate insulating layer between the conductive pattern and the channel patterns.

18. The semiconductor device of claim 15, wherein the first channel pattern includes a first part under the source/drain pattern and a second part under the gate pattern,
wherein a thickness of the first part is less than a thickness of the second part.

* * * * *